United States Patent [19]

Liebel et al.

[11] Patent Number: 4,559,099
[45] Date of Patent: Dec. 17, 1985

[54] ETCHING DEVICE

[75] Inventors: Gerhard Liebel; Bert Kegel, both of Munich, Fed. Rep. of Germany

[73] Assignee: Technics GmbH Europa, Munich, Fed. Rep. of Germany

[21] Appl. No.: 643,709

[22] Filed: Aug. 24, 1984

[51] Int. Cl.⁴ .......................... C23F 1/02; B44C 1/22; C03C 15/00
[52] U.S. Cl. .................................. 156/345; 156/643; 156/646; 204/298
[58] Field of Search ....................... 156/643, 646, 345; 204/164, 192 E, 298; 118/715, 50.1, 620

[56] References Cited

U.S. PATENT DOCUMENTS 4,065,369 12/1977 Ogawa et al. .................. 204/164
4,298,419 11/1981 Suzuki et al. .................. 156/345

Primary Examiner—William A. Powell
Attorney, Agent, or Firm—Kane, Dalsimer, Kane, Sullivan and Kurucz

[57] ABSTRACT

An etching device is disclosed which comprises a high frequency generator and a reactor in close proximity to each other. The reactor has a plasma zone and a processing zone which open directly into each other. The device is advantageous for chemical dry etching in that a short distance between plasma zone and processing zone offers the benefit of small radical loss.

9 Claims, 2 Drawing Figures

ETCHING DEVICE

Etching devices for chemical dry etching are known. For example, Tokuda Seisakusho, Ltd. describe an etching device where the plasma cavity or plasma zone and the etching chamber or processing zone are separated in order not to damage articles to be etched by the plasma. This known etching device has a constant nominal output of 1.35 kW presumably because of the fact that the microwaves are guided towards the plasma zone via a wave guide. Because of the said high constant nominal output and the correspondingly high plasma temperature, the known etching device must be provided with a cooling system.

It is one object of the invention to provide an etching device having a short distance between the plasma zone and the processing zone; such a short distance offers the benefit of a small radical loss.

It is a further object of the invention to provide an etching device having a large plasma zone and correspondingly large processing zone.

It is a further object of the invention to provide an etching device having a variable and moderate nominal output of less than 1.35 kW; because of the said moderate nominal output a cooling system is superfluous.

According to the invention an etching device is provided with comprises a high frequency-generator having a radiator and a resonator, where the said radiator projects directly into the said resonator;

a reactor having a plasma zone and a processing zone which open directly into each other, where one of these zones, the plasma zone, is surrounded by the said resonator except the direct opening of the said plasma zone into the said processing zone;

means for introducing the gaseous plasma medium into the said reactor and means for evacuating the said reactor.

The reactor can be described as a chamber which is only partially surrounded by the resonator and where the said zone surrounded by the resonator corresponds substantially to the plasma zone and the other zone substantially to the processing zone. The processing zone can be defined as the area of the reactor where the energy density of the microwaves has been reduced to such an extent that a plasma discharge is impossible. That means, that essentially only radicals appear in the processing zone and essentially no ions.

Since the plasma zone of the reactor according to the invention can be described as that zone of the reactor which is surrounded by the resonator, the only exception being the direct opening of the plasma zone into the processing zone, the etching device of the invention offers the benefit of a small radical loss because of the fact that the radicals produced in the plasma zone enter the processing zone directly.

The etching device according to the invention can be operated with a variable power (i.e. variable nominal output) of for example 30 to 300 W. Since, in addition, the radiator projects directly into the resonator (so that a wave guide is omitted), the vacuum can be intermittently broken in order to blow off solid particles from articles subjected to an etching treatment in the processing zone. It is decisive that after re-evacuating, the plasma can again be ignited in the plasma zone.

According to one embodiment of the invention the etching device is provided with a high frequency generator for an energization in the microwave range, preferably of a frequency of 1 to 30 and especially 2 to 5 GHz. The processing pressure is preferably in the range of $1 \times 10^{-1}$ to $2 \times 10^{1}$ hPa.

According to one embodiment of the etching device the reactor consists of two chambers which correspond substantially to the plasma zone and the processing zone and are connected by a ring-like sealing so that they can be easily separated. According to one specific embodiment of the etching device the two chambers are arranged above each other where the upper chamber is surrounded by the resonator.

According to one preferred embodiment the reactor in this invention is provided with a gas inlet so that the vacuum can be intermittently broken. The said gas inlet can end in one or several nozzles for blowing gas jets onto articles subjected to an etching treatment so that solid particles can be blown off.

Since the plasma zone and the processing zone open directly into each other so that the radical loss from the plasma zone to the processing zone is negligible, the invention offers the additional benefit that etching devices having reactor contents of, for example, up to 1, 2 or even 1000 l can be provided.

With the etching device according to the invention not only etching but also deposition processes can be carried out. As is well known, for example, $CF_4$ and $O_2$ can be used as the etching gas in the chemical dry etching. Compared with known plasma etching devices operating in the kHz or MHz ranges, the etching device according to the invention can be operated at reduced temperatures of, for example, lower than 40° C. Since the etching device according to the invention energizes the plasma at a high frequency, it is possible to provide a plasma-free processing zone, in addition to the plasma zone in the reactor.

In the following the invention is described in greater detail using figures.

Figure 1:
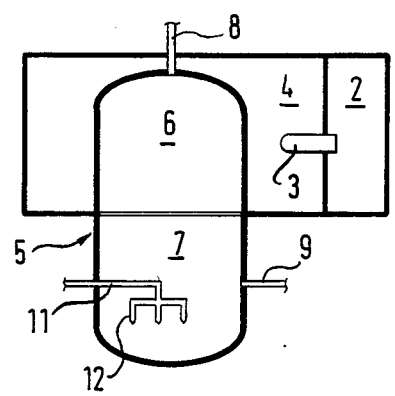
FIG. 1 shows the etching device of the invention schematically.

According to FIG. 1 the reactor 5 is formed by one single chamber where the upper area is surrounded by the resonator 4 of the high frequency generator 2. The plasma forms substantially in the said upper zone so that this zone can be called plasma zone 6. The reactor 5 is equipped with means 8 for introducing the gaseous plasma medium into the said reactor 5 and with means 9 for evacuating the said reactor 5. The reactor 5 can be made of quartz-glass. As can be seen from FIG. 1 the radiator 3 of the generator 2 projects directly into the resonator 4.

Figure 2:
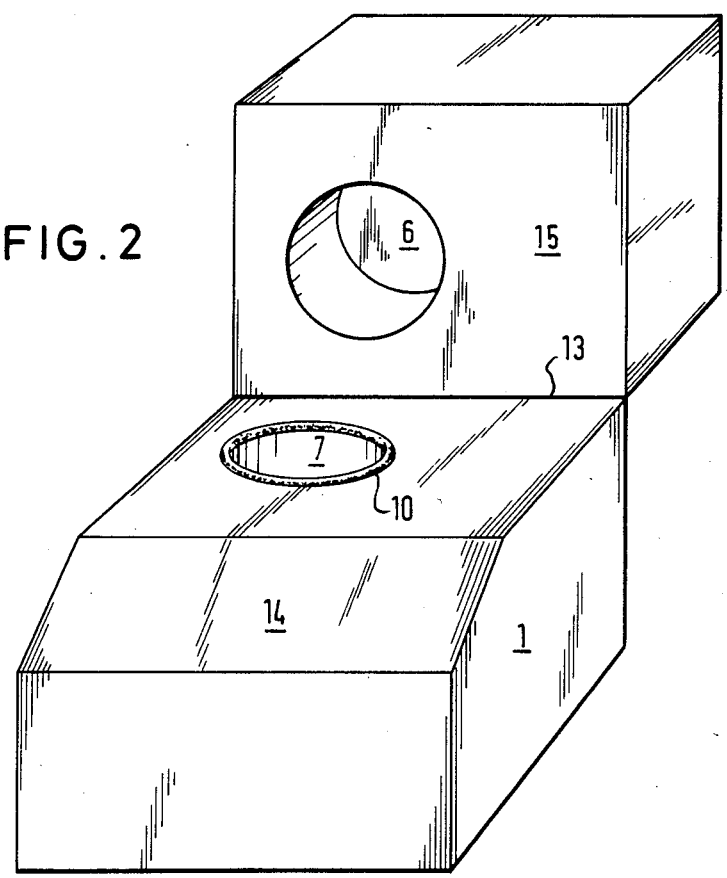
FIG. 2 is a simplified perspective view of an etching device according to the invention.

According to FIG. 2 the box-like etching device 1 consists of a lower part 14 and an upper part 15 where both parts 14, 15 are hinge-joined. The lower part 14 houses substantially the processing zone 7 and the upper part substantially the plasma zone 6. When the etching device 1 is closed and in operation, the plasma zone 6 and the processing zone 7 open directly into each other and are connected via a ring-like sealing 10.

We claim:

1. Etching device comprising
   a high frequency generator (2) having a radiator (3) and a resonator (4), where the said radiator (3) projects directly into the said resonator (4);
   a reactor (5) having a plasma zone (6) and a processing zone (7) which open directly into each other, where one of these zones, the plasma zone (6), is surrounded by the said resonator (4) except the direct opening of the said plasma zone (6) into the said processing zone (7);

means (8) for introducing the gaseous plasma medium into the said reactor (5); and means (9) for evacuating the said reactor (5).

2. Etching device according to claim 1, characterized by a high frequency generator (2) having a continuously variable power of 30 to 300 W.

3. Etching device according to claim 1, characterized by a high frequency generator (2) for an energization in the microwave range.

4. Etching device according to claim 3, characterized by a high frequency generator (2) of a frequency of 1 to 30 and especially 2 to 5 GHz.

5. Etching device according to claim 1, characterized by a reactor (5) adapted to a processing pressure range of $1 \times 10^{-1}$ to $2 \times 10^{1}$ hPa.

6. Etching device according to claim 1, characterized by two separate chambers (6, 7) connected by a ring-like sealing (10).

7. Etching device according to claim 6, characterized in that the two chambers (6, 7) are disposed above each other where the upper chamber (6) is surrounded by the resonator (4).

8. Etching device according to claim 1, characterized in that the reactor (5) is provided with a gas inlet (11) for intermittently breaking the vacuum.

9. Etching device according to claim 8, characterized in that the inlet (11) ends into one or several nozzles (12) for blowing gas jets onto articles treated.

* * * * *